US010083782B2

(12) United States Patent
Marien

(10) Patent No.: US 10,083,782 B2
(45) Date of Patent: Sep. 25, 2018

(54) PUNCHED PART FOR PRODUCING AN ELECTRICAL RESISTOR, CURRENT SENSOR AND CORRESPONDING PRODUCTION METHOD

(71) Applicant: Isabellenhuette Heusler GmbH & Co. KG, Dillenburg (DE)

(72) Inventor: Jan Marien, Wiesbaden (DE)

(73) Assignee: Isabellenhuette Heusler GmbH & Co. KG, Dillenburg (DE)

( * ) Notice: Subject to any disclaimer, the term of this patent is extended or adjusted under 35 U.S.C. 154(b) by 357 days.

(21) Appl. No.: 14/893,137

(22) PCT Filed: May 28, 2014

(86) PCT No.: PCT/EP2014/001456
§ 371 (c)(1),
(2) Date: Nov. 23, 2015

(87) PCT Pub. No.: WO2014/198382
PCT Pub. Date: Dec. 18, 2014

(65) Prior Publication Data
US 2016/0111189 A1    Apr. 21, 2016

(30) Foreign Application Priority Data

Jun. 10, 2013 (DE) .................. 10 2013 009 726

(51) Int. Cl.
*G01R 27/08* (2006.01)
*G01K 7/00* (2006.01)
(Continued)

(52) U.S. Cl.
CPC ............... *H01C 1/14* (2013.01); *G01R 1/203* (2013.01); *G01R 19/0092* (2013.01);
(Continued)

(58) Field of Classification Search
CPC .......... H01C 1/14; H01C 17/00; H01C 17/28; H01C 7/001; H01C 17/006; H01C 7/06;
(Continued)

(56) References Cited

U.S. PATENT DOCUMENTS 5,459,350 A   10/1995 Date et al.
5,534,788 A   7/1996 Smith et al.
(Continued)

FOREIGN PATENT DOCUMENTS

DE   20117650 U1   4/2003
DE   60128510 T2   1/2008
(Continued)

OTHER PUBLICATIONS

English language abstract for EP 1313109 A2 (2003).
(Continued)

*Primary Examiner* — Farhana Hoque
(74) *Attorney, Agent, or Firm* — Caesar Rivise, PC

(57) ABSTRACT

The invention relates to a punched part for producing an electrical resistor, in particular a current measuring resistor, comprising a resistor element (9) consisting of a low-resistance resistive material (for example Manganin®) and two electrical connection parts (10, 11) consisting of a conductor material (for example copper), wherein the resistor element (9) is arranged between the two electrical connection parts (10, 11) in the direction of current flow in such a way that the electrical current flows through the resistor element (9). In accordance with the invention, the punched part additionally has a landing area (14) for providing an integrated circuit (16) on the landing area (14) of the punched part. Furthermore, the invention comprises a current sensor comprising such a punched part and a corresponding production method.

19 Claims, 6 Drawing Sheets

(51) Int. Cl.

| | | |
|---|---|---|
| *H01C 1/14* | (2006.01) | |
| *G01R 1/20* | (2006.01) | |
| *H01C 7/00* | (2006.01) | |
| *H01C 17/00* | (2006.01) | |
| *H01C 17/28* | (2006.01) | |
| *G01R 19/00* | (2006.01) | |
| *H01C 1/144* | (2006.01) | |
| *H01C 7/06* | (2006.01) | |
| *G01R 3/00* | (2006.01) | |

(52) U.S. Cl.
CPC ............ *H01C 7/001* (2013.01); *H01C 17/00* (2013.01); *H01C 17/006* (2013.01); *H01C 17/28* (2013.01); *G01R 3/00* (2013.01); *H01C 1/144* (2013.01); *H01C 7/06* (2013.01)

(58) Field of Classification Search
CPC .... H01C 1/144; G01R 19/0092; G01R 1/203; G01R 3/00
USPC .................................. 324/126, 173; 374/185
See application file for complete search history.

(56) References Cited

U.S. PATENT DOCUMENTS

| | | | |
|---|---|---|---|
| 5,999,085 | A | 12/1999 | Szwarc et al. |
| 6,225,684 | B1 | 5/2001 | Stitt, II et al. |
| 6,946,845 | B2 | 9/2005 | Hetzler |
| 7,170,295 | B2 | 1/2007 | Hetzler |
| 8,598,976 | B2 | 12/2013 | Hetzler |
| 9,384,876 | B2 | 7/2016 | Tsukada et al. |
| 2003/0011355 | A1 | 1/2003 | Skerritt et al. |
| 2003/0222511 | A1 | 12/2003 | Hetzler |
| 2004/0263150 | A1 | 12/2004 | Hetzler |
| 2009/0315537 | A1* | 12/2009 | Kidd ...................... G01R 15/14 324/118 |
| 2010/0001382 | A1 | 1/2010 | Udompanyavit et al. |
| 2012/0154104 | A1 | 6/2012 | Hetzler |
| 2012/0327973 | A1* | 12/2012 | Hetzler .................. G01R 1/203 374/185 |
| 2014/0191772 | A1 | 7/2014 | Hetzler |
| 2014/0247108 | A1 | 9/2014 | Tsukada et al. |

FOREIGN PATENT DOCUMENTS

| | | |
|---|---|---|
| DE | 102006039722 A1 | 2/2008 |
| DE | 102009031408 A1 | 1/2011 |
| DE | 102010009835 A1 | 9/2011 |
| DE | 102011113002 A1 | 3/2013 |
| EP | 0605800 A1 | 7/1994 |
| EP | 1363131 A1 | 11/2003 |
| EP | 1252526 B1 | 11/2004 |
| JP | H06216307 A | 8/1994 |
| JP | 2005017293 A | 1/2005 |
| JP | 2006228980 A | 8/2006 |
| JP | 2008054812 A | 3/2008 |
| JP | 2012531760 A | 12/2012 |
| JP | 2013089664 A | 5/2013 |
| JP | 5534788 B2 | 7/2014 |
| JP | 6150714 B2 | 6/2017 |
| WO | 9618109 A2 | 6/1996 |

OTHER PUBLICATIONS

English language abstract for DE 10 2006 039 722 A1 (2008).
English language abstract for EP 0 605 800 A1 (1994).
International Search Report for PCT/EP2014/001456 dated Oct. 8, 2014.
English language abstract of JP 2011-111784 A corresponding to JP 5534788 A (2011).
English language abstract of JP 2015-098448 A corresponding to JP 6150714 B2 (2015).
Translation of Japanese Patent Office Communication in corresponding JP 2016-518859 dated Jan. 10, 2018.

* cited by examiner though a printed circuit board as in the case of the prior art according to EP 1 363 131 A1.

PUNCHED PART FOR PRODUCING AN ELECTRICAL RESISTOR, CURRENT SENSOR AND CORRESPONDING PRODUCTION METHOD

BACKGROUND OF THE INVENTION

The invention relates to a punched part for producing an electrical resistor, in particular a current-measuring resistor. The invention relates further to a current sensor having such a punched part, and to a suitable production method.

It has already been known for a relatively long time to measure electric currents by the so-called four-conductor technique using a low-ohm current-measuring resistor ("shunt"). The electric current to be measured is thereby passed through the current-measuring resistor, the electric voltage drop across the current-measuring resistor being measured. The measured voltage is proportional to the current to be measured and thus constitutes a measure of the electric current.

It is known from EP 0 605 800 A1 to produce such a current-measuring resistor from a composite material strip 1, as is shown by way of example in FIG. 1. The composite material 1 accordingly consists of two strips 2, 3 made of a conductor material (e.g. copper) and a strip 4 made of a resistance material (e.g. CuMnNi alloy), the strip 4 made of the resistance material being arranged between the two strips 2, 3 of the conductor material and being welded to the strips 2, 3 of the conductor material along its longitudinal edges 5, 6. When the current-measuring resistors are produced from the composite material strip 1, punched parts are punched out of the composite material 1 transversely to the longitudinal direction of the strip, each punched part then forming a current-measuring resistor. The known punched parts according to EP 0 605 800 A1 accordingly have only two current connecting parts for passing the electric current in and out and a resistor element, which is arranged between the two current connecting parts in the direction of current flow and through which the electric current to be measured therefore flows.

Measurement of the electric voltage drop across the current-measuring resistor is generally carried out by means of an integrated circuit (ASIC: application specific integrated circuit), as is known, for example, from EP 1 363 131 A1. The integrated circuit used for measuring the voltage is generally connected to the current-measuring resistor by means of a printed circuit board via soldered connections, which leads to various disadvantages.

On the one hand, the integrated circuit and the current-measuring resistor are generally packaged separately in a housing, resulting in twice the outlay in terms of packaging.

On the other hand, the characteristics of the resistor and of the integrated circuit can only be matched in combination on the printed circuit board.

Furthermore, between the input stage of the input amplifier of the integrated circuit and the voltage tap of the current-measuring resistor, there are soldered connections, vias and conductor paths on the printed circuit board, which can lead to undesirable parasitic effects (e.g. thermovoltages, induction loops, crosstalk of other signals).

It is therefore desirable to integrate the current-measuring resistor and the integrated circuit for voltage measurement in a common housing. One possible approach is known from US 2010/0001382 A1, but this requires additional working steps which are not established in today's standard production methods.

In relation to the prior art, reference is further to be made to U.S. Pat. No. 5,534,788 A, DE 10 2006 039 722 A1, DE 10 2009 031 408 A1, DE 42 43 349 A1, DE 10 2011 113 002 A1 and DE 102 37 126 A1.

Finally, DE 601 28 510 T2 discloses a punched part having a landing area for provision with an integrated circuit. However, the punched part here consists of a uniform material and is therefore not suitable for a precision resistor. In a precision resistor, the actual resistor element on the one hand and the connecting parts on the other hand must consist of different materials. For example, the resistor element can consist of a copper-manganese-nickel alloy, while the connecting parts consist of copper or a copper alloy. The punched part according to DE 601 28 510 T2 is accordingly not suitable for a precision resistor.

SUMMARY OF THE INVENTION

Accordingly, the object underlying the invention is to provide an improved possibility for integration of a current-measuring resistor with an evaluation circuit.

The object is achieved by a punched part, a current sensor having such a punched part, and a corresponding production method according to the claims.

The invention includes the general technical teaching of producing the current-measuring resistor from a punched part made of a composite material strip, the punched part comprising not only—as in the known method according to EP 0 605 800 A1—the current connecting parts and the resistor element, but additionally also a landing area for provision with an integrated circuit on the landing area of the punched part. The expression landing area used within the context of the invention means that an integrated circuit which serves to measure the voltage can later be arranged on the landing area of the punched part. The integrated circuit which serves to measure the voltage is then advantageously situated in the immediate vicinity of the current-measuring resistor. It is to be mentioned here that the expression landing area originates from the fact that the integrated circuit, when mounted, is supplied from above and thus lands, as it were, on the landing area of the punched part.

Accordingly, the invention first provides a punched part from which an electrical resistor (e.g. current-measuring resistor) can then be produced. In conformity with the punched part known from EP 0 605 800 A1, the punched part according to the invention firstly has a resistor element made of a low-ohm resistance material (e.g. MANGANIN®).

The punched part according to the invention additionally comprises, in conformity with the known punched part according to EP 0 605 800 A1, two current connecting parts which consist of a conductor material (e.g. copper) and the function of which is to pass the electric current into or out of the resistor.

The resistor element is arranged between the two connecting parts in the direction of current flow, so that the electric current flows through the resistor element.

In the preferred embodiment of the invention, the two current connecting parts are arranged spaced apart from one another on the same side of the resistor element. However, it is also possible in principle for the two current connecting parts to be arranged on opposite sides of the resistor element.

The punched part according to the invention is distinguished from the punched part known from EP 0 605 800 A1 in that the punched part additionally has a landing area for provision with an integrated circuit.

The expression punched part used within the context of the invention includes singularized punched parts, whereby a resistor is produced from each punched part. However, the expression punched part used within the context of the invention additionally also includes blanks which have not yet been singularized and are used to produce a plurality of resistors, to which end the individual resistors simply have to be separated from the blank.

In the preferred embodiment of the invention, the punched part has two voltage measuring contacts for measuring the electric voltage drop across the resistor element of the resistor. The punch geometry is accordingly so designed that not only the current connecting parts, the resistor element and the landing area for the integrated circuit are formed in the punching operation, but also the two voltage measuring contacts for voltage measurement by the known four-conductor technique.

In the preferred embodiment of the invention, the punched part additionally comprises a plurality of external electrical contacts for the electrical contacting of the integrated circuit from outside. Accordingly, when the punched part according to the invention is punched out, the external contacts for the electrical contacting of the integrated circuit are preferably also produced at the same time.

It is to be mentioned here that the external contacts are separated from the landing area for the integrated circuit and/or from the voltage measuring contacts by a punched-out region. This is important in order that no short circuit occurs between the individual external contacts on the one hand and the landing area or the voltage measuring contacts on the other hand.

It is further to be mentioned that the voltage measuring contacts on the one hand and the current connecting parts on the other hand are preferably arranged on opposite sides of the resistor element. The electric current to be measured is accordingly passed in or out on one side of the resistor element, whereas the voltage measurement by means of the voltage measuring contacts takes place on the opposite side of the resistor element.

It has already been mentioned above that the two current connecting parts can be laterally adjacent to the resistor element with respect to the direction of current flow in the resistor element, in particular on the same side of the resistor element. This facilitates punching out of a conventional composite material strip, as is shown, for example, in FIG. 1. One strip of the conductor material (e.g. copper) then forms the two current connecting parts, while the opposite strip of the conductor material forms the current measuring contacts, the landing area for the integrated circuit and the external contacts for the integrated circuit.

In the preferred embodiment of the invention, the conductor material is copper or a copper alloy, but the invention is not limited to those materials. It is important only that the conductor material has sufficiently great electrical conductivity.

The resistance material of the resistor element, on the other hand, is preferably a copper alloy, such as, for example, a copper-manganese-nickel alloy, whereby Cu84Ni4Mn12 can preferably be used. Alternatively, however, it is possible for the resistance material of the resistor element to be a nickel alloy, in particular NiCr or CuNi. However, the invention is not limited in respect of the resistance material to the examples mentioned above but can in principle also be implemented with other materials. However, the specific electrical resistance of the conductor material is to be lower than the specific electrical resistance of the resistance material.

The resistance material is additionally to have a specific electrical resistance with as low a temperature coefficient as possible, the temperature coefficient preferably being less than $5 \cdot 10^{-4} K^{-1}$, $2 \cdot 10^{-4} K^{-1}$, $1 \cdot 10^{-4} K^{-1}$ or $5 \cdot 10^{-5} K^{-1}$.

In the preferred embodiment of the invention, the specific electrical resistance of the resistance material is less than $2 \cdot 10^{-4}$ $\Omega \cdot m$, $2 \cdot 10^{-5}$ $\Omega \cdot m$ or $2 \cdot 10^{-6}$ $\Omega \cdot m$.

The conductor material, on the other hand, preferably has a specific electrical resistance which is less than $2 \cdot 10^{-5}$ $\Omega \cdot m$, $2 \cdot 10^{-6}$ $\Omega \cdot m$ or $2 \cdot 10^{-7}$ $\Omega \cdot m$.

It is further to be mentioned that the resistor element in the preferred embodiment is connected electrically and mechanically to the two current connecting parts, in particular by a welded connection. It is particularly advantageous if the individual strips of the composite material strip are connected together by electron beam welding, so that the resistor element and the current connecting parts are then also connected together by electron beam welding.

In the preferred embodiment of the invention, the current connecting parts and the resistor element are plate-shaped, which is known per se from the prior art cited at the beginning. The expression plate-shaped resistor element or plate-shaped current connecting parts used within the context of the invention includes both flat configurations and bent configurations.

In addition, the invention not only claims protection for the punched part according to the invention described above but also relates to a current sensor comprising such a punched part.

Furthermore, in the preferred embodiment, the current sensor according to the invention also comprises an integrated circuit which is mounted on the landing area of the punched part and serves to measure the voltage. For example, the integrated circuit can be an integrated circuit as is known from EP 1 363 131 A1.

In a preferred embodiment of the invention, the current sensor comprises two integrated circuits which form an input stage and an output stage and are preferably galvanically separated, for example by a capacitive, inductive or optical coupling.

The input stage is connected to the voltage measuring contacts by bond connections in order to measure the electric voltage drop across the resistor element.

The output stage, on the other hand, emits an output signal which reflects the electric voltage drop across the resistor element, in particular in digital form. The output circuit preferably comprises a sigma-delta modulator which emits a 1-bit data stream as the output signal, which is known per se from EP 1 363 131 A1.

However, it is also possible for the output signal to be an analogue output voltage which is proportional to the electric voltage drop across the resistor element.

It is further possible for the output signal to be an electric current which is proportional to the electric voltage drop across the resistor element.

In the preferred embodiment of the invention, the integrated circuit is also connected by bond connections to the external contacts and/or to the voltage measuring contacts. The bond connections are hereby produced after the punched part has been punched out and after the integrated circuit has been placed on the landing area of the punched part.

In the preferred embodiment of the invention, the finished current sensor has an electrically insulating sheathing which encloses the integrated circuit, the bond connections and the resistor, whereby the external contacts of the integrated circuit and the current connecting parts of the resistor protrude from the sheathing.

The sheathing preferably consists of a plastics material, such as, for example, a thermosetting plastic, which has been found to be advantageous. The sheathing can thus be produced, for example, by overmolding the integrated circuit, the bond connection and the resistor with the plastics material (e.g. thermosetting plastic).

It is further to be mentioned that the current sensor according to the invention can comprise a plurality of resistor elements in order to be able to measure a plurality of electric currents. A field of use of such a current sensor having a plurality of resistor elements is in polyphase current measurement in an alternating-current polyphase network. Another field of use of such a current sensor having a plurality of resistance elements is in differential current measurement, as is described, for example, in DE 10 2011 113 002 A1.

Finally, the invention also includes a corresponding production method for producing a current sensor, which already follows in part from the above description.

In conformity with the known production method according to EP 0 605 800 A1 described at the beginning, the production method according to the invention first provides that a composite material strip having two outer strips made of a conductor material (e.g. copper) and a middle strip made of a resistance material (e.g. MANGANIN®) is provided, the strips being connected together electrically and mechanically along their longitudinal edges, in particular by welding (e.g. electron beam welding).

In conformity with the known production method according to EP 0 605 800 A1, the production method according to the invention additionally provides that the composite material strip is punched so that a punched part of the composite material strip remains, the punched part having at least one resistor with a resistor element made of the resistance material and two current connecting parts made of the conductor material.

The production method according to the invention is distinguished by the fact that the punched part also has at least one landing area for provision with an integrated circuit on the landing area of the punched part.

In the production method according to the invention, the punched part additionally preferably also comprises two voltage measuring contacts and/or a plurality of external electrical contacts for the electrical contacting of the integrated circuit.

After the punched part has been punched out of the composite material, the landing area on the punched part is then preferably provided with an integrated circuit.

The integrated circuit is then connected to the external contacts and to the voltage measuring contacts by bond connections.

In a further method step, the resistor, the integrated circuit and the bond connections are then preferably sheathed with a sheathing of a plastics material, whereby the external contacts of the integrated circuit and the current connecting parts of the resistor protrude from the sheathing.

In a further working step, the production method according to the invention then also provides that individual current sensors are singularized from the composite material strip by separation of the individual current sensors transversely to the longitudinal direction of the composite material strip.

BRIEF DESCRIPTION OF SEVERAL VIEWS OF THE DRAWINGS

Other advantageous further developments of the invention will be explained in greater detail hereinbelow with reference to the figures, together with the description of the preferred embodiments of the invention. In the figures.

DETAILED DESCRIPTION OF PREFERRED EMBODIMENTS

Figure 1:
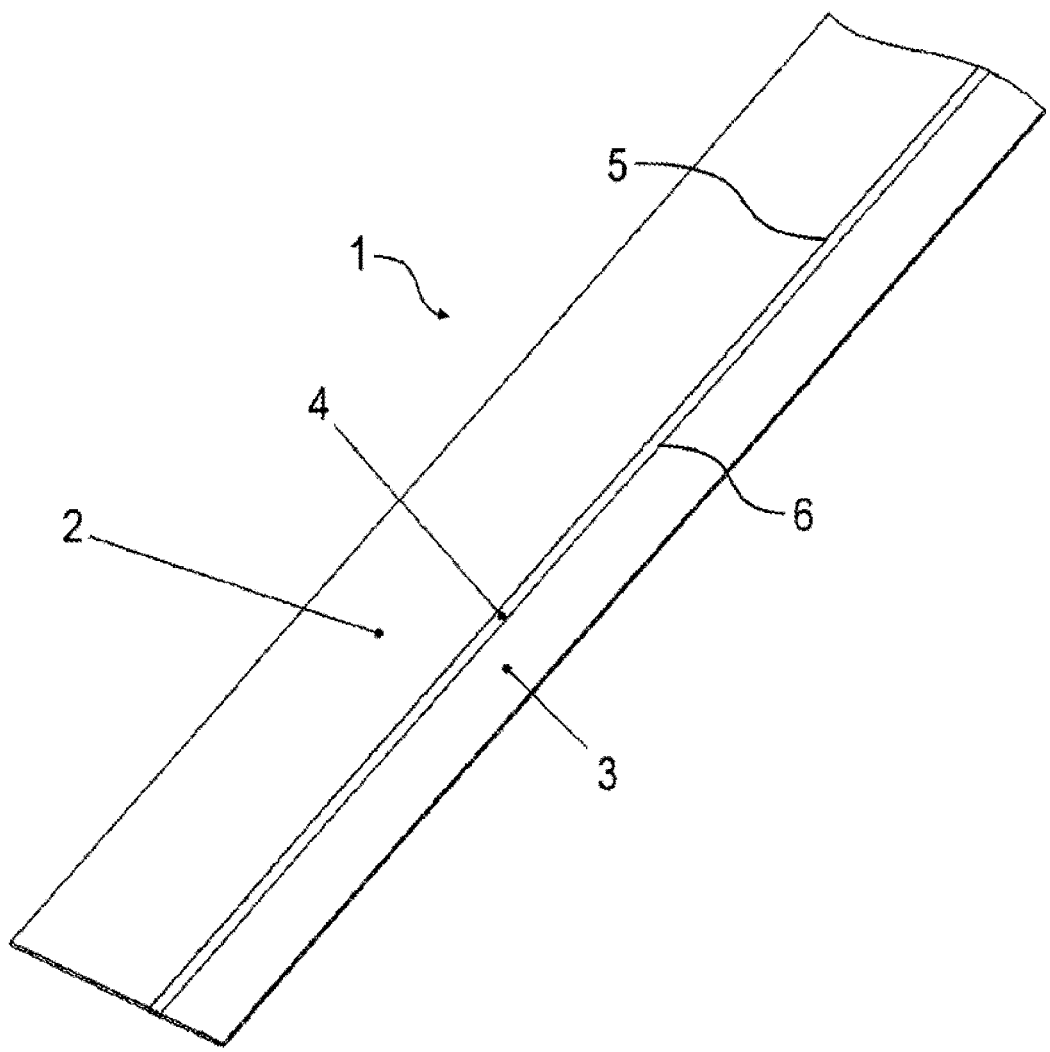
FIG. 1 shows a perspective view of a conventional composite material strip, which is also used within the context of the invention.
Figure 2A:
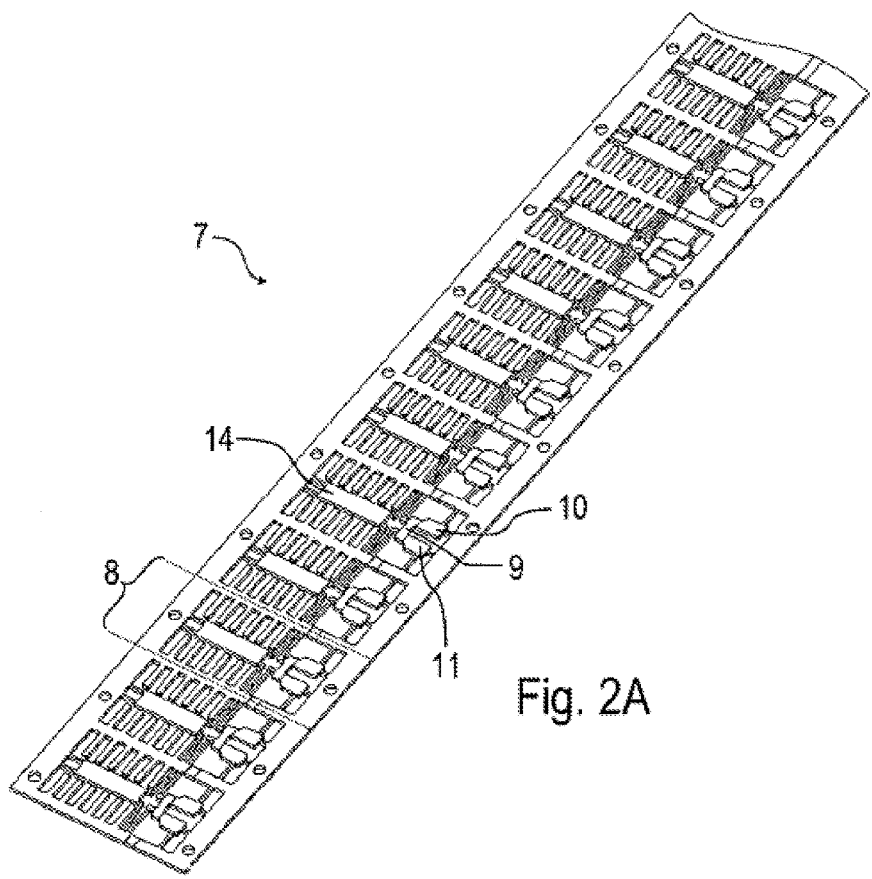
FIG. 2A shows a perspective view of a punched part according to the invention which has been punched out of the composite material strip according to FIG. 1 and is used to produce a plurality of current sensors.
Figure 2B:
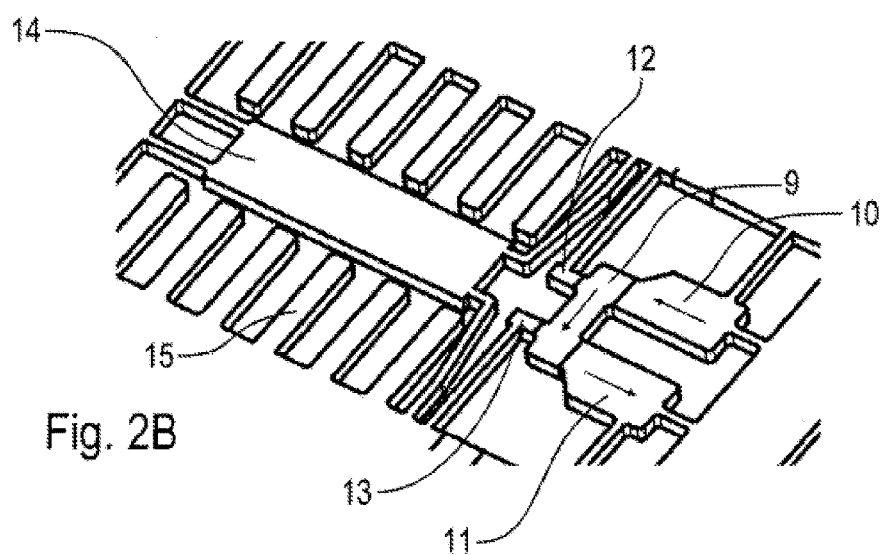
FIG. 2B shows an enlarged representation of a detail of FIG. 2A in the region of a current sensor.

FIGS. 2A and 2B show a preferred embodiment of a punched part 7 according to the invention which can be punched out of the composite material strip 1 according to FIG. 1, the punched part 7 having a plurality of blanks 8 one behind the other in the longitudinal direction of the strip, each of which blanks is to form a current sensor after further processing steps.

The individual blanks 8 of the punched part 7 each have a resistor element 9 which consists of the material of the middle strip 4, so that the resistor element 9 consists of the resistance material (e.g. Manganin®) of the strip 4.

Each blank 8 of the punched part 7 further comprises two current connecting parts 10, 11 for passing in the current to be measured and for passing out the electric current to be measured, respectively. The two current connecting parts 10, 11 consist of the material of the strip 3 made of the conductor material (e.g. copper), so that the two current connecting parts 10, 11 also consist of the conductor material.

It is to be mentioned here that the two current connecting parts 10, 11 are arranged on the same side of the resistor element 9 as a result of their production, so that the electric current is passed in and out on the same side of the resistor element 9. The current connecting part 10 hereby serves to pass the electric current into the resistor element 9, while the current connecting part 11 serves to pass the electric current out of the resistor element 9.

Each blank 8 of the punched part 7 further comprises two voltage measuring contacts 12, 13 for measuring the electric voltage drop across the resistor element 9. That measured voltage is proportional to the electric current flowing through the resistor element 9 and therefore, according to Ohm's law, constitutes a measure of the electric current to be measured.

Each blank 8 of the punched part 7 further has a landing area 14 which can be provided with an integrated circuit, as will be described in greater detail below.

Finally, each blank 8 of the punched part 7 comprises a plurality of external electrical contacts 15 for the electrical contacting of the integrated circuit arranged on the landing area 14, the connection between the external contacts 15 and the integrated circuit being described in greater detail below. The individual external contacts 15 are separated from the landing area 14 and from the voltage measuring contacts 12, 13 by a cut-out region.

Figure 3A:
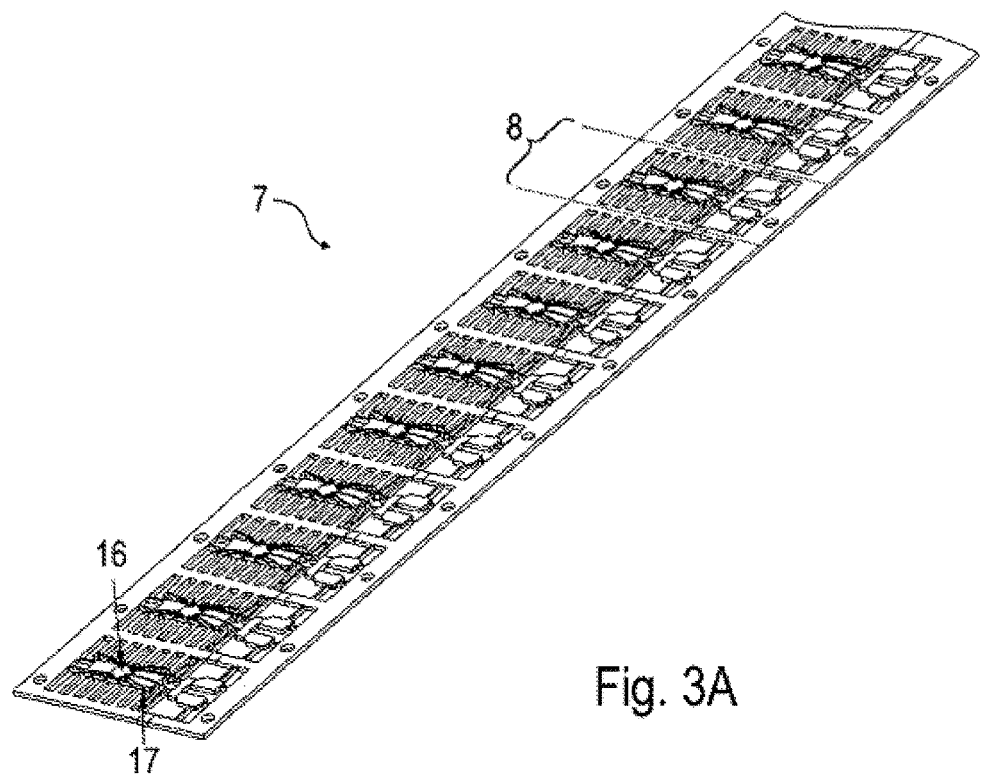
FIG. 3A shows a perspective view of the punched part of FIG. 2A, wherein integrated circuits have in each case been placed on the landing areas and are connected to the connecting parts and to the voltage measuring contacts by means of bond connections.
Figure 3B:
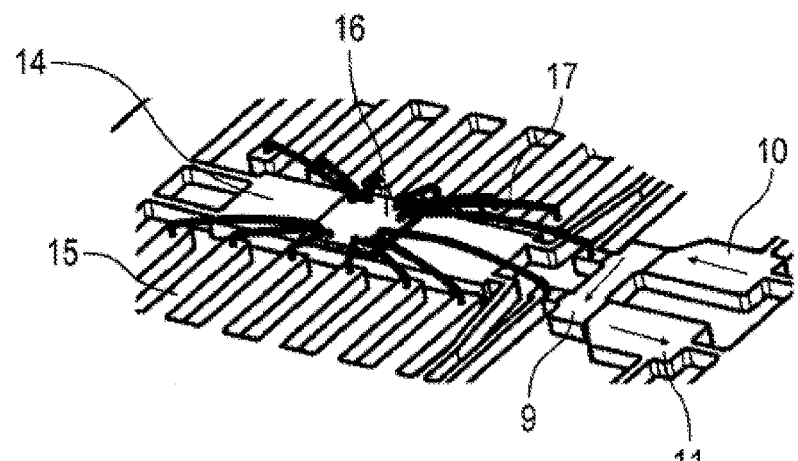
FIG. 3B shows an enlarged representation of a detail of FIG. 3A in the region of a single current sensor.

FIGS. 3A and 3B show an advanced method stage of the production method according to the invention.

In this method stage, the individual landing areas 14 of the individual blanks 8 are each already provided with an integrated circuit 16, and the connecting contacts of the integrated circuit 16 are connected to the associated external contacts 15 by bond connections 17.

In addition, the voltage measuring contacts 12, 13 are also connected to the integrated circuit 16 by bond connections 17, so that the integrated circuit 16 is able to measure the electric voltage drop across the resistor element 9 by means of the voltage measuring contacts 12, 13.

Figure 4:
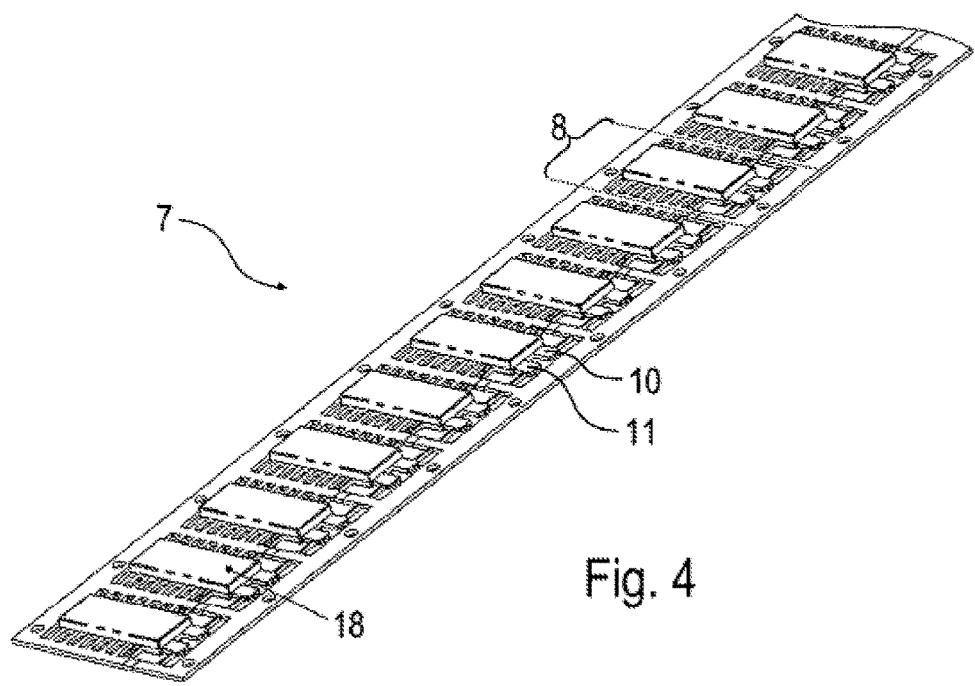
FIG. 4 shows a perspective view of the punched part of FIG. 3A, wherein the individual current sensors are already sheathed.

FIG. 4 shows an even further advanced method stage of the production method according to the invention. In this method stage, the individual blanks 8 of the punched part 7 are each overmolded with a sheathing 18 of thermosetting plastic, whereby the current connecting parts 10, 11 on the one hand and the external contacts 15 on the other hand protrude from the sheathing 18.

Figure 5:
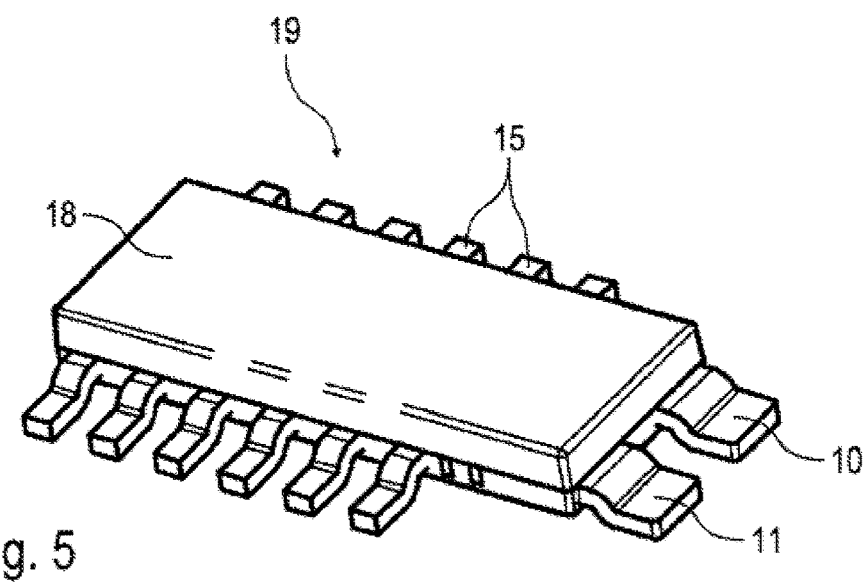
FIG. 5 shows a perspective view of a finished current sensor which has been separated from the punched part according to FIG. 4.

Finally, FIG. 5 shows a current sensor 19 according to the invention which has been separated from the punched part 7 according to FIG. 4. The individual current sensors 19 can be singularized from the punched part 7 according to FIG. 4 by punching, for example, or by another separating method.

Figure 6:
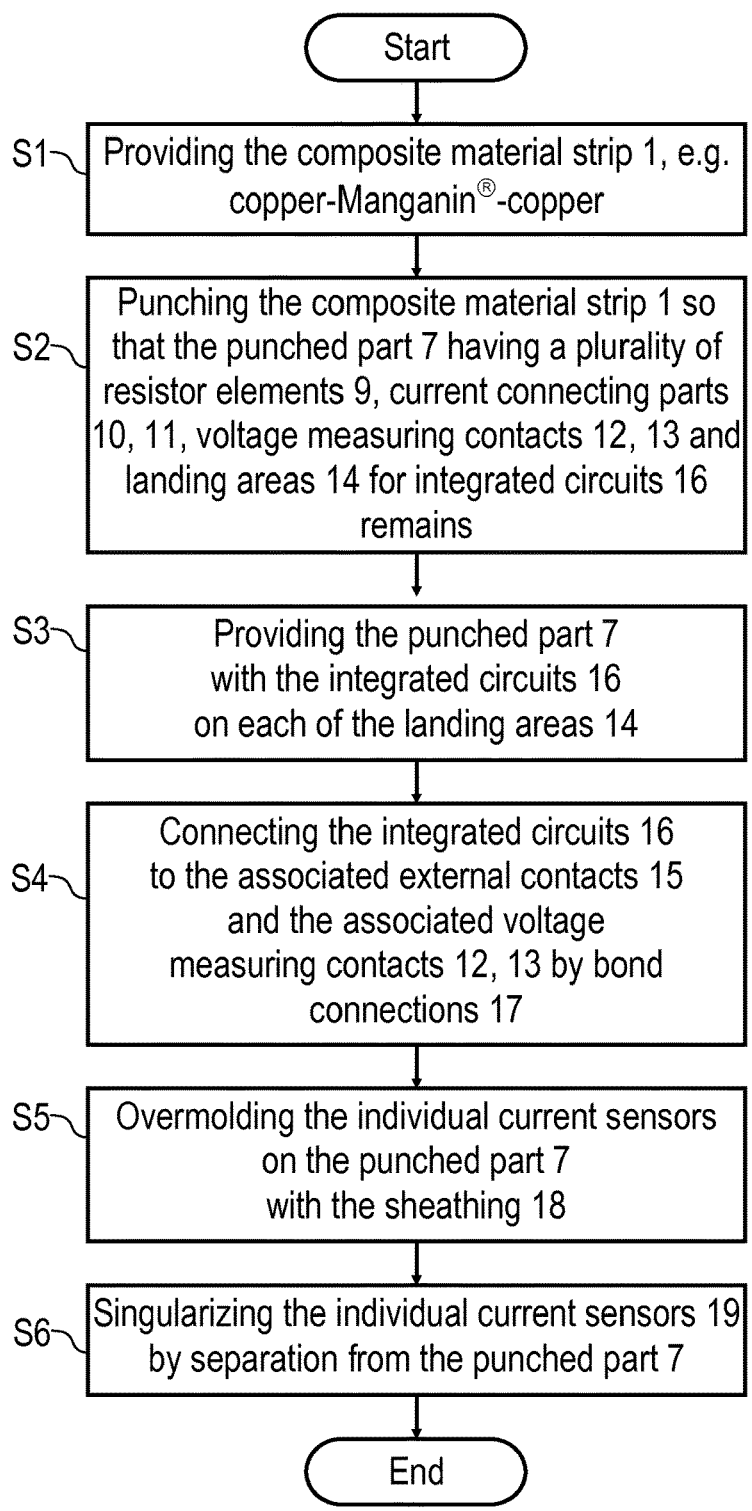
FIG. 6 shows the production method according to the invention in the form of a flow diagram.

FIG. 6 shows the production method according to the invention in the form of a flow diagram.

In a first step S1, the conventional composite material strip 1, as is shown, for example, in FIG. 1, is first provided. However, it is to be noted here that the strip 2 has a greater width than the strip 3, because the strip 2 must also form the landing area 14 for the integrated circuit 16, which requires a greater width.

In a further step S2, the composite material strip 1 is then punched, so that the punched part 7 according to FIG. 2A remains.

In the next step S3, the punched part 7 according to FIG. 2A is then provided with the integrated circuits 16.

In a further step S4, the integrated circuits 16 are then connected to the external contacts 15 and to the voltage measuring contacts 12, 13 by the bond connections 17, as is shown in FIG. 3A.

In a step S5, the individual current sensors 19 are then overmolded with the sheathing 18 of the thermosetting plastic, as is shown in FIG. 4.

In the last step S6, the individual current sensors 19 are then singularized by separation of the individual current sensors 19 from the punched part 7.

Figure 7:
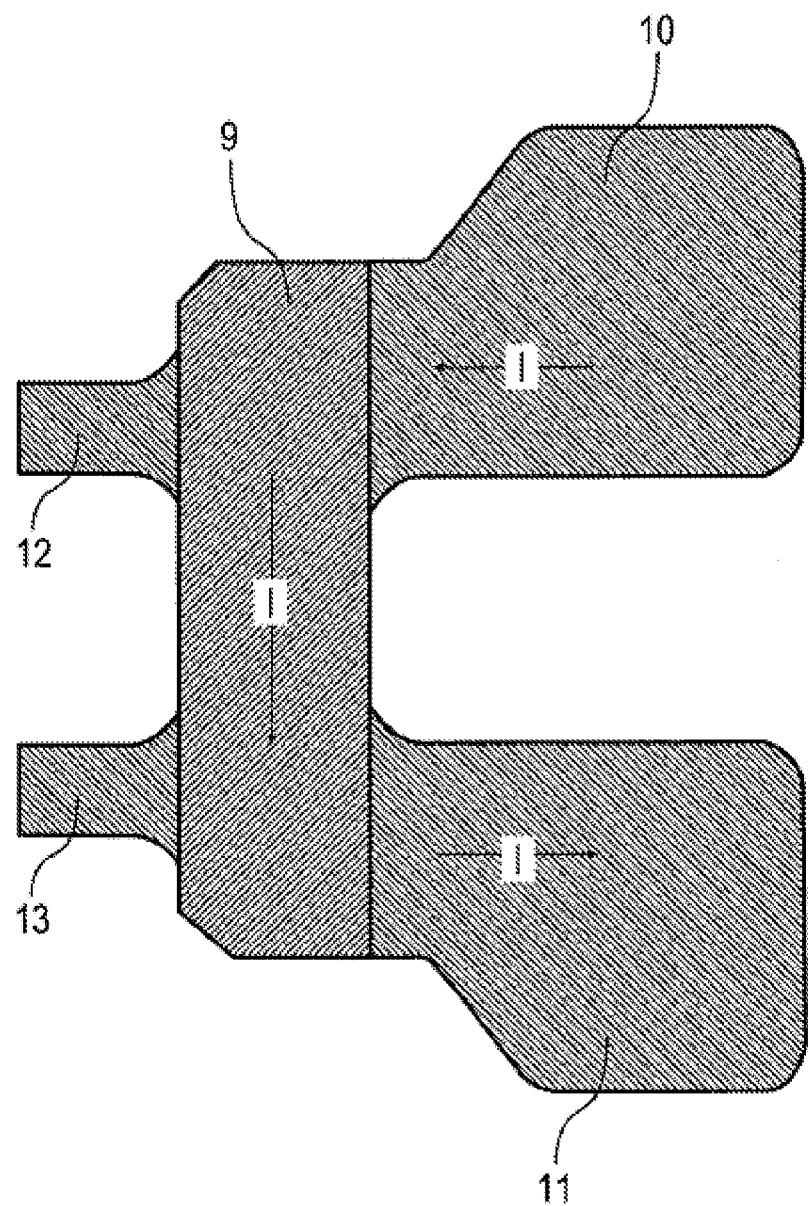
FIG. 7 shows a schematic representation of a current-measuring resistor as is used within the scope of the invention.

Finally, FIG. 7 shows the direction of current flow in the current connecting parts 10, 11 and in the resistor element 9, as well as the position of the voltage measuring contacts 12, 13. It will be seen from this representation that the current connecting parts 10, 11 are arranged on one side of the resistor element 9, while the voltage measuring contacts 12, 13 are situated on the opposite side of the resistor element 9.

The invention is not limited to the preferred embodiments described above. Rather, a plurality of variants and modifications are possible which likewise make use of the concept according to the invention and therefore fall within the scope of protection. In particular, the invention also claims protection for the subject-matter and the features of the dependent claims independently of the claims on which they are dependent.

LIST OF REFERENCE NUMERALS

1 Composite material strip
2 Strip made of conductor material
3 Strip made of conductor material
4 Strip made of resistance material
5 Longitudinal edge of the strip made of the resistance material
6 Longitudinal edge of the strip made of the resistance material
7 Punched part
8 Blank
9 Resistor element
10 Current connecting part
11 Current connecting part
12 Voltage measuring contact
13 Voltage measuring contact
14 Landing area for the integrated circuit
15 External contacts of the integrated circuit
16 Integrated circuit
17 Bond connections
18 Sheathing
19 Current sensor

The invention claimed is:

1. A punched part for producing an electrical resistor, comprising:
   a) a resistor element comprising a low-ohm resistance material,
   b) a first current connecting part comprising a conductor material for passing an electric current into the electrical resistor, and
   c) a second current connecting part comprising a conductor material for passing the electric current out of the electrical resistor,
   wherein:
   d) the resistor element is arranged between the first current connecting part and the second current connecting part in a direction of current flow, so that the electric current flows through the electrical resistor,
   e) the punched part is punched out of a composite material strip,
   f) the punched part further comprises a landing area arranged to receive an integrated circuit,
   g) the composite material strip comprises a plurality of strips which are connected together along their longitudinal edges,
   h) individual strips of the composite material strip are welded together,
   i) the composite material strip has a middle band and two outer bands, the outer bands comprising the conductor material, while the middle band comprises the resistance material, and j) the direction of current flow in the resistor element runs parallel to a longitudinal direction of the composite material strip.

2. The punched part according to claim 1, further comprising a first voltage measuring contact and a second voltage measuring contact for measuring the electric voltage drop across the resistor element.

3. The punched part according to claim 2, further comprising a plurality of external electrical contacts for electrical contacting of the integrated circuit from outside.

4. The punched part according to claim 3, wherein the external electrical contacts are separated from the landing area for the integrated circuit and from the voltage measuring contacts by a punched-out region.

5. The punched part according to claim 2, wherein the voltage measuring contacts on the one hand and the current connecting parts on the other hand are arranged on opposite sides of the resistor element.

6. The punched part according to claim 1, wherein the two current connecting parts are laterally adjacent to the resistor element with respect to the direction of current flow in the resistor element.

7. A punched part for producing an electrical resistor, comprising:
a) a resistor element comprising a low-ohm resistance material,
b) a first current connecting part comprising a conductor material for passing an electric current into the electrical resistor, and
c) a second current connecting part comprising a conductor material for passing the electric current out of the electrical resistor,
wherein:
d) the resistor element is arranged between the first current connecting part and the second current connecting part in a direction of current flow, so that the electric current flows through the electrical resistor, and
e) the punched part is punched out of a composite material strip, and
f) the punched part further comprises a landing area arranged to receive an integrated circuit, and
g) the conductor material of the current connecting parts is copper or a copper alloy, and
h) the resistance material of the resistor element is a copper alloy, and
i) the resistor element is connected electrically and mechanically to the two current connecting parts, and
j) the resistance material has a specific electrical resistance with a temperature coefficient of less than $5 \cdot 10^{-4} K^{-1}$, and
k) the resistance material has a specific electrical resistance of less than $2 \cdot 10^{-4} \Omega \cdot m$, and
l) the conductor material has a specific electrical resistance of less than $10^{-5} \Omega \cdot m$, and
m) the specific electrical resistance of the conductor material is lower than the specific electrical resistance of the resistance material.

8. A current sensor comprising a punched part, said punched part comprising:
a) a resistor element comprising a low-ohm resistance material,
b) a first current connecting part comprising a conductor material for passing an electric current into the electrical resistor, and
c) a second current connecting part comprising a conductor material for passing the electric current out of the electrical resistor,
wherein:
d) the resistor element is arranged between the first current connecting part and the second current connecting part in a direction of current flow, so that the electric current flows through the electrical resistor,
e) the punched part is punched out of a composite material strip, and
f) the punched part further comprises a landing area arranged to receive an integrated circuit, wherein the landing area is integrally formed with the punched part when the punched part is punched out of the composite material strip.

9. The current sensor according to claim 8, further comprising at least one integrated circuit which is mounted on the landing area of the punched part.

10. The current sensor according to claim 9, further comprising:
a) a first integrated circuit which is connected to voltage measuring contacts by bond connections in order to measure an electric voltage drop across the resistor element,
b) a second integrated circuit, and
c) a galvanic separation between the second integrated circuit and the voltage measuring contacts.

11. The current sensor according to claim 9, wherein the current sensor has an output circuit emitting an output signal which reflects an electric voltage drop across the resistor element.

12. The current sensor according to claim 11, wherein the output circuit comprises a sigma-delta modulator which emits a 1-bit data stream as the output signal.

13. The current sensor according to claim 11, wherein the output signal is an analogue output voltage which is proportional to the electric voltage drop across resistor element.

14. The current sensor according to claim 11, wherein the output signal is an electric current which is proportional to the electric voltage drop across the resistor element.

15. The current sensor according to claim 9, wherein the integrated circuit is connected to external contacts and to voltage measuring contacts by bond connections.

16. The current sensor according to claim 8, wherein the current sensor comprises a plurality of resistor elements configured to measure a plurality of electric currents.

17. A current sensor comprising a punched part, said punched part comprising:
a) a resistor element comprising a low-ohm resistance material,
b) a first current connecting part comprising a conductor material for passing an electric current into the electrical resistor,
c) a second current connecting part comprising a conductor material for passing the electric current out of the electrical resistor,
d) a first integrated circuit, which is connected to voltage measuring contacts by bond connections in order to measure an electric voltage drop across the resistor element,
e) a second integrated circuit,
f) a galvanic separation between the second integrated circuit and the voltage measuring contacts, and
g) an electrically insulating sheathing which encloses the first and second integrated circuits, the bond connections and the electrical resistor,
wherein:
i) the resistor element is arranged between the first current connecting part and the second current connecting part in a direction of current flow, so that the electric current flows through the electrical resistor, ii) the punched part, is punched out of a composite material strip, iii) the punched part further comprises a landing area on which the first and second integrated circuits are mounted, and iv) external contacts of the first and second integrated circuits and the current connecting parts of the electrical resistor protrude from the sheathing.

18. The current sensor according to claim 17, wherein a) the insulating sheathing comprises a plastics material, and b) the integrated circuit, the bond connections and the electrical resistor are overmolded with the plastics material of the insulating sheathing.

19. A production method for producing a current sensor, comprising the following steps:

a) providing a composite material strip which has two outer strips comprising a conductor material and a middle strip comprising a resistance material, the strips being connected together electrically and mechanically along their longitudinal edges, b) punching the composite material strip so that a punched part of the composite material strip remains, wherein the punched part comprises: (i) at least one resistor with a resistor element comprising the resistance material, (ii) two current connecting parts comprising the conductor material, (iii) at least one landing area arranged to receive an integrated circuit, (iv) two voltage measuring contacts for measuring an electric voltage drop across the resistor element, (v) a plurality of external electrical contacts for electrical contacting of the integrated circuit from outside, c) providing the at least one landing area on the punched part with the integrated circuit, d) electrically connecting the integrated circuit to the external contacts and to the voltage measuring contacts by bond connections, e) sheathing the electrical resistor, the integrated circuit and the bond connections with a sheathing comprising a plastics material, such that the external contacts of the into rated circuit and the current connecting parts of the electrical resistor protrude from the sheathing, and f) singularizing current sensors by separation transversely to a longitudinal strip direction of the punched part.

* * * * *